(12) United States Patent
Hsu et al.

(10) Patent No.: US 6,845,414 B2
(45) Date of Patent: Jan. 18, 2005

(54) APPARATUS AND METHOD OF ASYNCHRONOUS FIFO CONTROL

(75) Inventors: Fu-Chou Hsu, Taoyuan Hsien (TW); Kuo-Wei Yeh, Miaoli Hsien (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 474 days.

(21) Appl. No.: 10/099,236

(22) Filed: Mar. 15, 2002

(65) Prior Publication Data

US 2003/0177295 A1 Sep. 18, 2003

(51) Int. Cl.$^7$ .......................... G06F 13/00; G06F 13/14; G06F 7/00; H03M 7/16
(52) U.S. Cl. ............................. 710/52; 710/53; 710/56; 710/57; 710/18; 710/19; 710/29; 341/97; 341/98; 377/34
(58) Field of Search .......................... 710/52, 53, 56, 710/57, 15, 18, 19, 29; 341/97, 98; 377/34

(56) References Cited

U.S. PATENT DOCUMENTS

| | | | | |
|---|---|---|---|---|
| 5,084,841 A | * | 1/1992 | Williams et al. | 365/189.07 |
| 5,426,756 A | * | 6/1995 | Shyi et al. | 711/159 |
| 5,790,891 A | * | 8/1998 | Solt et al. | 710/34 |
| 6,337,893 B1 | * | 1/2002 | Pontius | 377/108 |
| 6,434,642 B1 | * | 8/2002 | Camilleri et al. | 710/57 |
| 6,553,448 B1 | * | 4/2003 | Mannion | 711/2 |
| 6,703,950 B2 | * | 3/2004 | Yi | 341/97 |
| 6,718,449 B2 | * | 4/2004 | Phi | 711/167 |

* cited by examiner

Primary Examiner—Fritz Fleming
Assistant Examiner—Tanh Q Nguyen
(74) Attorney, Agent, or Firm—Merchant & Gould P.C.

(57) ABSTRACT

An apparatus and method for controlling an asynchronous First-In-First-Out (FIFO) memory. The asynchronous FIFO has separate, free running read and write clocks. A number of n-bit circular Gray code counters are used to handshake the operation between read and write parts of the FIFO, wherein n is any integer more than one. Additional binary counters are used to accumulate the read and write overflows for the circular Gray code counters. When any circular Gray code counter is overflow, the read or write count is transferred to the respective binary counter for recording the FIFO accesses.

12 Claims, 6 Drawing Sheets

| | | Write part | | | | Read part | | | |
|---|---|---|---|---|---|---|---|---|---|
| step | action | Wmaster | Rslave | Wacc | Wptr | Rmaster | Wslave | Racc | Rptr |
| 0 | Write | 00 | 00 | 0 | 0 | 00 | 00 | 0 | 0 |
| 1 | Write | 01 | 00 | 0 | 1 | 00 | 00 | 0 | 0 |
| 2 | Write | 11 | 00 | 0 | 2 | 00 | 00 | 0 | 0 |
| 3 | Write | 10 | 00 | 0 | 3 | 00 | 00 | 0 | 0 |
| 4 | Write | 10 | 00 | 1 | 4 | 00 | 00 | 0 | 0 |
| | | 10 | 00 | 2 | 5 | 00 | 00 | 0 | 0 |
| | | | | | | | | | |
| 5 | Read | 10 | 00 | 2 | 5 | 00 | 00 | 0 | 0 |
| 6 | | 10 | 00 | 2 | 5 | 01 | 01 | 0 | 1 |
| | | 00 | 01 | 1 | 5 | 01 | 01 | 0 | 1 |
| 7 | Read | 00 | 01 | 1 | 5 | 01 | 01 | 0 | 1 |
| 8 | Write | 00 | 11 | 1 | 5 | 11 | 11 | 0 | 2 |
| | | 01 | 11 | 1 | 6 | 11 | 11 | 0 | 2 |

$B_n = G_n$
$B_i = G_i + B_i \,;\, i \neq n$

| | | Write part | | | | Read part | | | |
|---|---|---|---|---|---|---|---|---|---|
| step | action | Wmaster | Rslave | Wacc | Wptr | Rmaster | Wslave | Racc | Rptr |
| 0 | Write | 00 | 00 | 0 | 0 | 00 | 00 | 0 | 0 |
| 1 | Write | 01 | 00 | 0 | 1 | 00 | 00 | 0 | 0 |
| 2 | Write | 11 | 00 | 0 | 2 | 00 | 00 | 0 | 0 |
| 3 | Write | 10 | 00 | 0 | 3 | 00 | 00 | 0 | 0 |
| 4 | Write | 10 | 00 | 1 | 4 | 00 | 00 | 0 | 0 |
| | | 10 | 00 | 2 | 5 | 00 | 00 | 0 | 0 |
| | | | | | | | | | |
| 5 | Read | 10 | 00 | 2 | 5 | 00 | 00 | 0 | 0 |
| 6 | | 10 | 00 | 2 | 5 | 01 | 01 | 0 | 1 |
| | | 00 | 01 | 1 | 5 | 01 | 01 | 0 | 1 |
| 7 | Read | 00 | 01 | 1 | 5 | 01 | 01 | 0 | 1 |
| 8 | Write | 00 | 11 | 1 | 5 | 11 | 11 | 0 | 2 |
| | | 01 | 11 | 1 | 6 | 11 | 11 | 0 | 2 |

503

APPARATUS AND METHOD OF ASYNCHRONOUS FIFO CONTROL

BACKGROUND OF THE INVENTION

1. Field of the Invention

The present invention relates to a first-in-first-out random access memory (FIFO RAM), and more particularly to an apparatus and method for controlling the access of an asynchronous dual port FIFO memory.

2. Description of Related Art

Metastability, e.g. unstable transient state, is a major problem of controlling an asynchronous dual port FIFO. Different access frequencies in read and write may result in uncertainty of operating addresses specified by a read pointer and a write pointer. For instance, the FIFO control on the write part needs to sample the value of the read pointer for checking the signal FIFO_FULL status with a write clock that is asynchronous to a read clock. Similarly, the FIFO control on the read part needs to sample the value of the write pointer for checking the signal FIFO_EMPTY status with the read clock that is asynchronous to the write clock. However, this may lead to a situation where each bit of the read pointer is changing state from "1" to "0" or "0" to "1", and every signal bit goes metastable.

The Gray code method is one of the most common approaches to overcome the problem of metastability. Gray code is a unit of distance code; that is, no more than one bit is changed between two adjacent codes. FIG. 1 shows an example of a 3-bit Gray code counter. Gray code method can reduce the metastable bits to the minimum while the pointers are being sampled. The sampled value will at most have one bit error each time. This means that the Gray-coded pointer only changes one bit between two adjacent values. The previous and current values in the counter will be sampled, and the two are corrected for checking FIFO pointers. FIG. 2 illustrates an asynchronous dual port FIFO containing 8 depth of words (not shown). Two 3-bit Gray code pointers 21, 22 (the aforementioned read pointer and write pointer), the different read and write frequencies RCLK, WCLK and their respective synchronizing circuits 210, 220 are used to implement the FIFO. The FIFO is deemed empty (FIFO_EMPTY) when the read point and the write pointer are equal. When the next write pointer value is equal to the current read pointer value through presentations of read and write FIFO status indicators 23, 24, it means the FIFO is full (FIFO_FULL). As such, the read pointer 21 and the write pointer 22 need to be converted to read and write binary counters 25, 26, for indicating read and write addresses of the FIFO, and a subtraction is then performed on the read and write binary counters 27, 28 in order to determine the available space in the FIFO.

Although the Gray code method solves the problem of metastability, it has three disadvantages. First, it is difficult to code the counter in the form of a state machine with the states encoded with Gray code when a long asynchronous FIFO is being implemented. Second, complex detection of FIFO_FULL signal and complicated Gray code arrangement incur problems of timing slacks and large circuit areas. For example, 8 conditions need to be compared to determine whether or not the FIFO is almost full if a 3-bits Gray code counter is implemented. The 8 conditions includes, for example: when the pseudo code in write_pointer is "100" and the pseudo code in read_pointer is "000", the pseudo code in FIFO_FULL is the value "1"; when the pseudo code in write_pointer is "000" and the pseudo code in read_pointer is "001", the pseudo code in FIFO_FULL is the value "1", . . . , etc. Finally, the Gray code method requires Gray-to-binary converters and subtractors to indicate the status of the FIFO. This leads to increased costs. The circuit and equation of an n-bit Gray-to-Binary conversion are shown in FIG. 3, wherein n is any integer more than one. In this example, if the addresses are n-bit wide so the input 31 includes one input line for each of the n bits, wherein n is any integer more than one. The output 32 also includes n individual output lines 34. The n-bit Gray-to-Binary conversion is accomplished using the exclusive OR (XOR) gates 35 and the equations Bn, Bi as shown, wherein n is any integer more than one.

SUMMARY OF THE INVENTION

Accordingly, an object of the invention is to provide a method and apparatus for controlling the access of an asynchronous dual port FIFO efficiently.

Another object of the invention is to provide an asynchronous dual port FIFO having n-bit Gray code counters for handshaking between the read part and write part of the FIFO.

According to the invention, circular Gray code counters are used for handshaking between the FIFO read part and write part. Additional binary counters are used to accumulate the read and write overflows for the circular Gray code counters. When any circular Gray code counter is overflow, the read or write count is transferred to the respective binary counter for recording the FIFO accesses.

An FIFO status indicator uses one of the binary counters for indicating used space of the FIFO. Also, the level of the memory used in the FIFO can state the FIFO status with FIFO_FULL and FIFO_EMPTY in the write part and read part respectively.

The invention provides an application of an asynchronous FIFO control without any limitation on the read and write frequencies. Also, the binary counters and few n-bit Gray counters have better timing slack and smaller area than the typical Gray code implementation.

BRIEF DESCRIPTION OF THE DRAWINGS

The invention will become apparent by referring to the following detailed description of a preferred embodiment with reference to the accompanying drawings, wherein:

Figure 1:
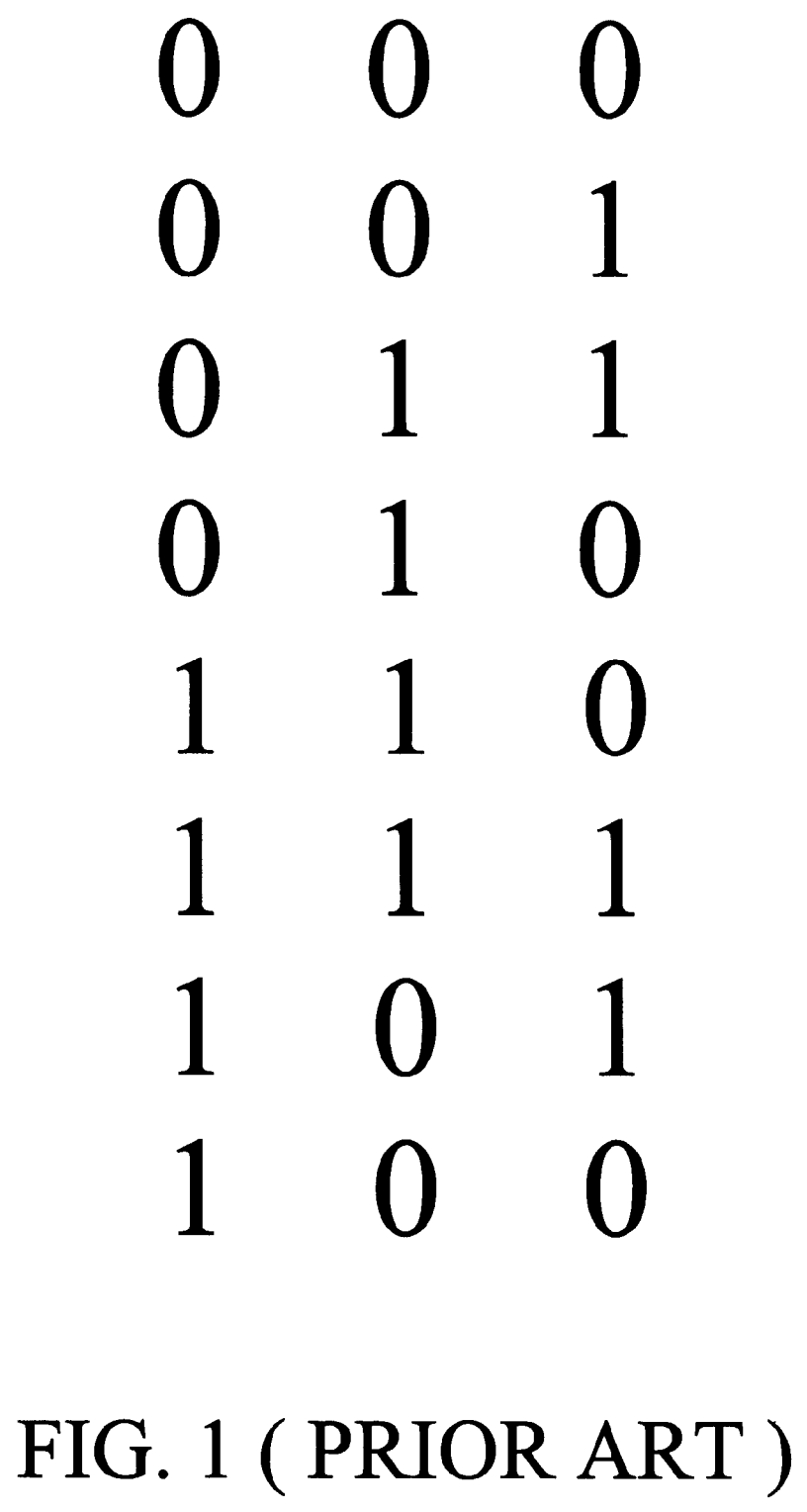

FIG. 1 shows an example of 3-bit Gray code counter;

DETAILED DESCRIPTION OF THE INVENTION

The Gray code counter can minimum the metastable bits while the read and write counters are being sampled. When an FIFO has the depth of $2^n$, a Gray code counter with at least n bits will be implemented in each read and write pointers. The Gray code counter can express the depth of the FIFO such that the Gray code read pointer will never overstep the write pointer. Similarly, the Gray code write pointer will never overstep the read pointer. For example, when the FIFO is empty, the read pointer is equal to the write pointer and the subsequent read request will be disabled and the read pointer is not counted.

Two circular Gray code counters with n bits are used in handshaking read and write parts, wherein n is any integer greater than one. Because the circular Gray code counters are not sufficient for indicating the values of the read and write pointers; additional binary counters are used for accumulating overflows of the read and write Gray code counters. For instance, a two-bit gray-coded write pointer can indicate four write requests with 00, 01, 11, 10. If the FIFO contains more than four elements, in the write part, the count is transferred to the binary counter for recording the write operation when the FIFO is not full and the gray-coded write counter is overflow. The action of the read part is the same as the write part does.

Figure 2:
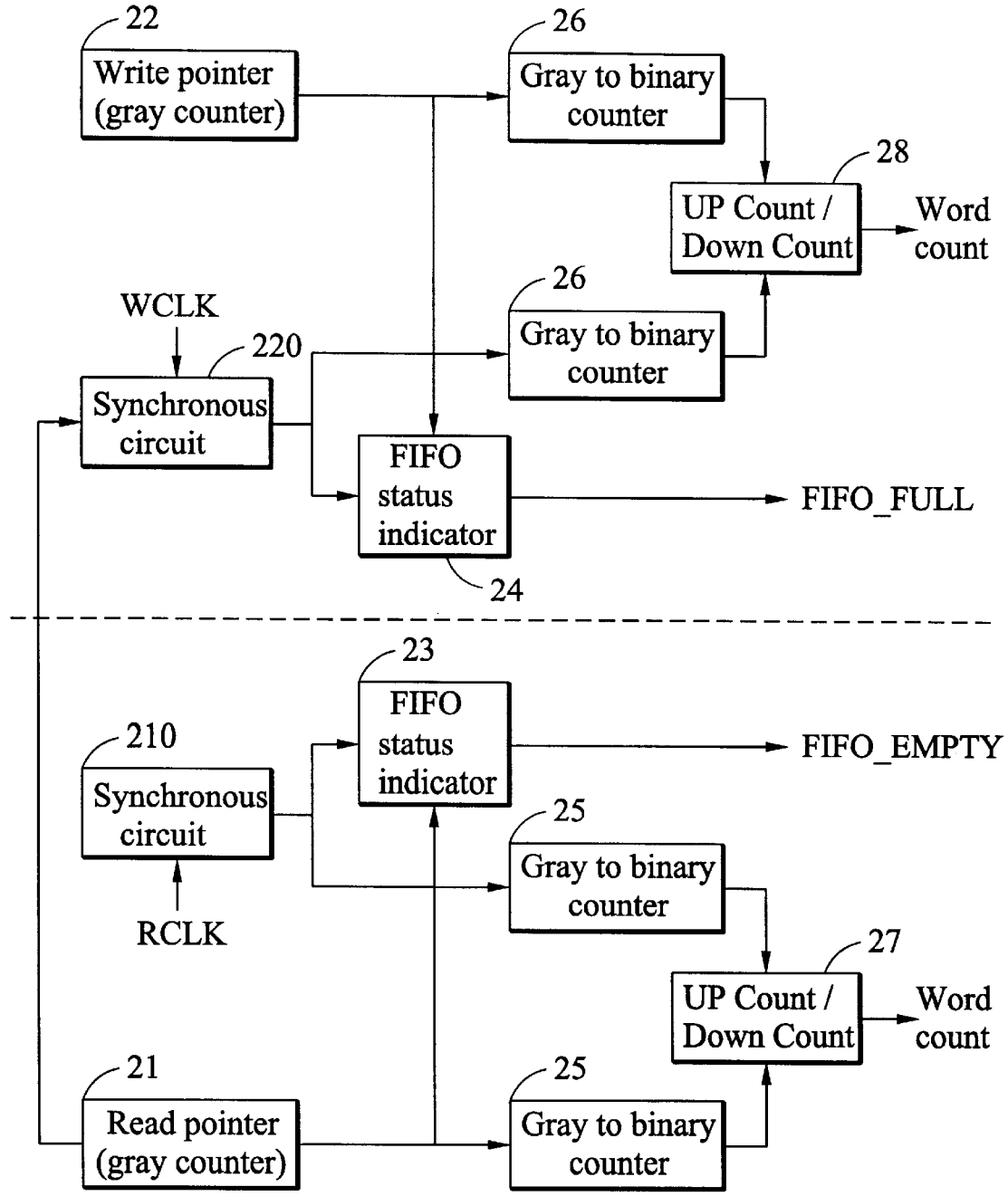
FIG. 2 illustrates a block diagram of an asynchronous dual port FIFO using the Gray code method.
Figures 3, 4:
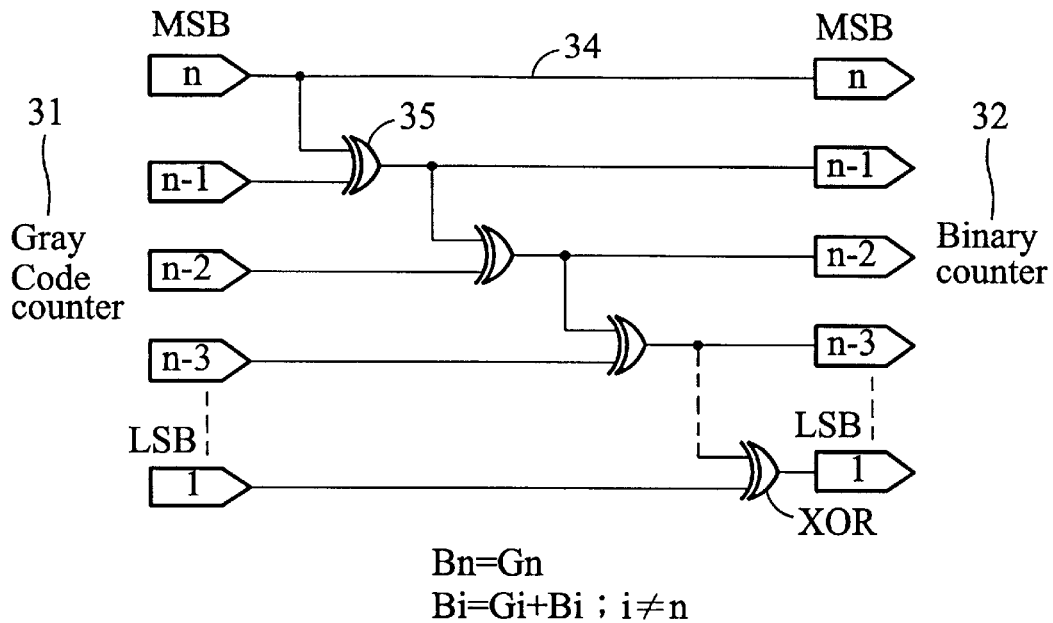
FIG. 3 is an example of an n-bit Gray-to-binary converter.
FIG. 4 shows an example of the action of the counters according to the invention.

FIG. 4 shows an example of the action of the counters according to the invention. The asynchronous dual port FIFO contains 16 elements and each of the read part and the write part contains two Gray code counters, namely, Wmaster and Rslave or Rmaster and Wslave. In the write part, Wmaster is a 2-bit Gray code counter for recording actions of write requests. Rslave is another 2-bit Gray code counter for synchronizing with the read part. A binary counter Wacc that cooperates with Wmaster is used for recording the overflow of Wmaster. The write pointer Wptr is a binary counter. In this example, the write frequency is faster than the read frequency. The initial status is shown in step 0. From steps 0 to 4, five write requests are serviced. In step 3, Wslave of the read part is sampled by the write part and the sampled result is compared with Wmaster for detecting the overflow. When the overflow is detected, Wmaster stops counting and the counter Wacc increases one. In step 5, Wmaster is sampled by the read part and the sampled result is compared with the Wslave. Because Wmaster and the Wslave are different in comparison, Wslave increases by one. Meanwhile, Rmaster increases by one since an FIFO read request is performed. In step 6, the overflow state is cancelled such Wmaster increases by one and Wacc reduces by one. In step 7, the same step is performed as in step 5. Step 8 is the same as step 6 except that Wacc is not decreased because an FIFO write request is input. The read part symmetrical to the write part (see FIG. 5) has the same performance identical to the write part. As such, under the overflow control in respective write and read binary counters, Wmaster will never overstep Wslave and Rmaster will never overstep Rslave. With the cooperation of the Gray code counters and the binary counters, the bit numbers of each Gray code counter can be reduced. Thus, the binary counters and Gray code counters of the present invention have better timing slack and smaller area than the typical gray code implementation that needs the same size in conventional FIFO.

Figure 5:
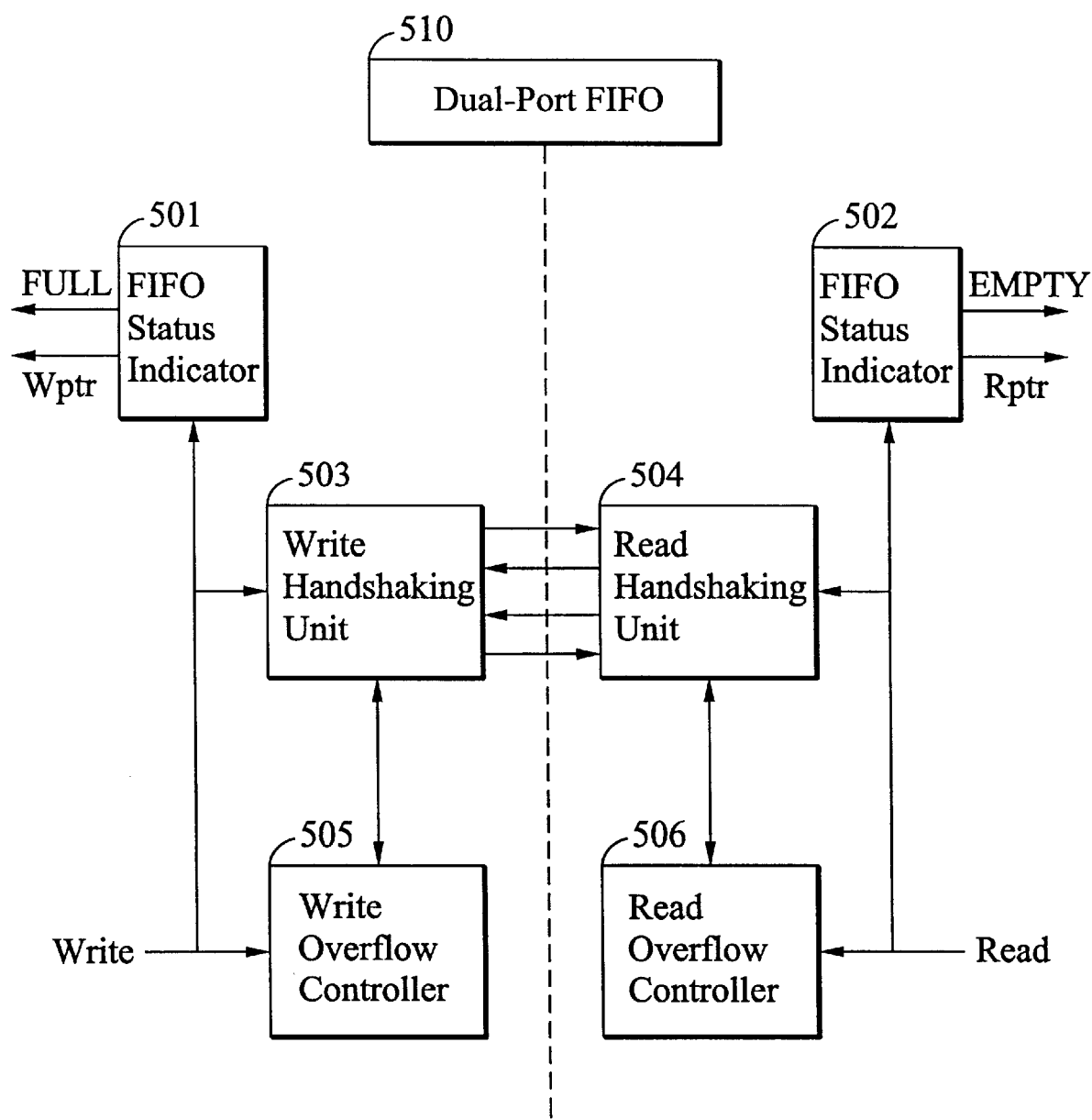
FIG. 5 illustrates an asynchronous dual port FIFO in accordance with the invention.

FIG. 5 illustrates the asynchronous dual port FIFO 500 in accordance with the invention. The asynchronous dual port FIFO 500 comprises a dual port random access memory (RAM) 510. Input data are written into the RAM 510 through an input port (not shown) and a write pointer Wptr indicates a write address. Output data are read from the RAM 510 through an output port (not shown) and a read pointer Rptr indicates a read address. The FIFO 500 further comprises a pair of read and write parts with symmetrical implementation. Each part contains an FIFO status indicator (501, 502), a handshaking unit (503, 504), and an overflow controller (505, 506). The FIFO status indicator (501, 502) indicates the levels of the RAM 510 use in an FIFO pointer and the read or write pointer (see FIG. 8). The level of the RAM 510 use in the FIFO pointer can state the FIFO full with FULL (see FIG. 8) in the write part and the FIFO empty with EMPTY in the read part. Each pointer is a binary counter. The handshaking unit (503, 504) contains two n-bit Gray code counters and a synchronizing circuit (see FIG. 6), wherein n is any integer more than one. The synchronizing circuit can be an Flip/Flop. The overflow controller (505, 506) cooperates with the handshaking unit to obtain the performance of FIG. 4. As cited, the performance is identical to both read and write parts. For simplicity, the further description only gives to the write part as shown in FIGS. 6 to 8.

Figure 6:
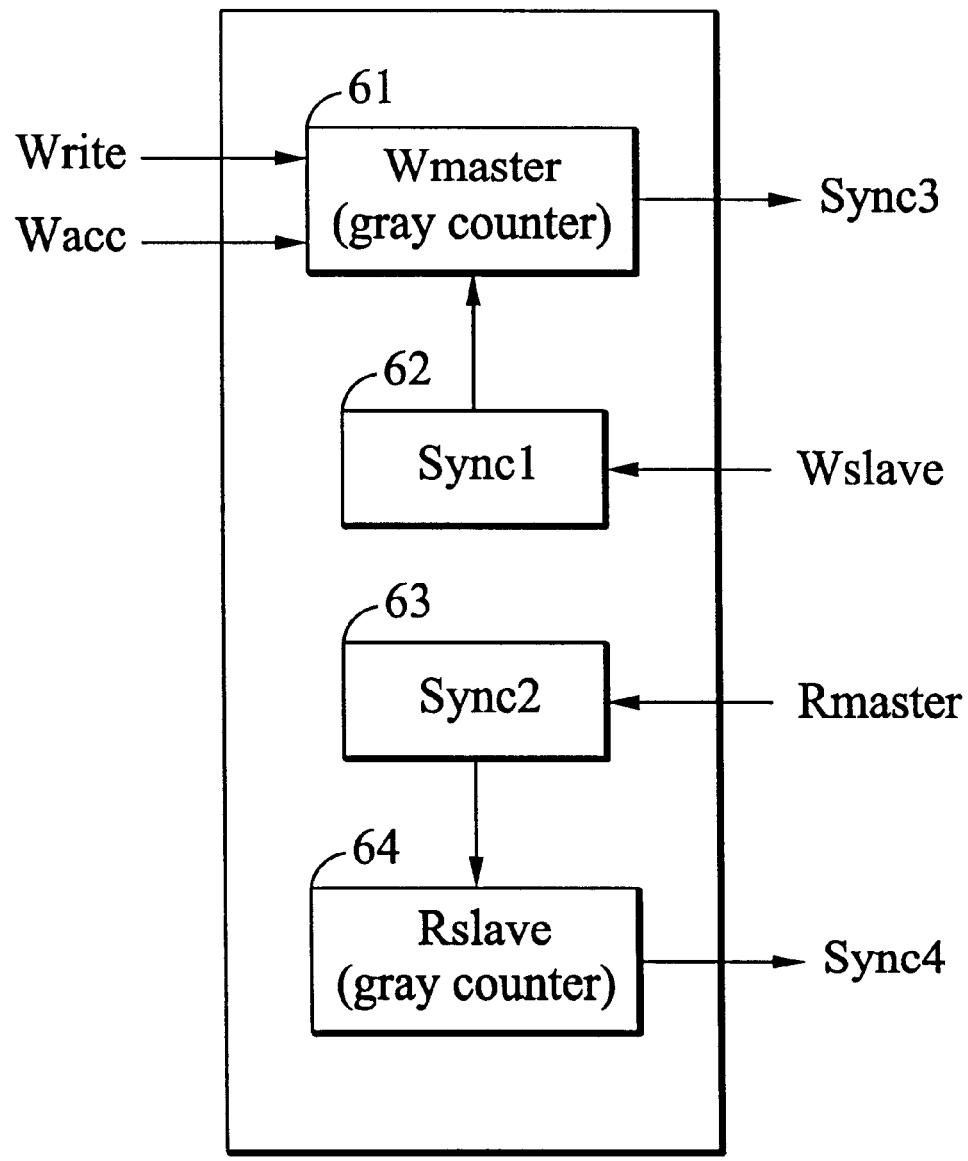
FIG. 6 is a block diagram of the handshaking unit in the write part of FIG. 5 according to the invention.

FIG. 6 is a block diagram of the handshaking unit 503 in the write part of FIG. 5 according to the invention. In the handshaking unit, one n-bit gray counter is Wmaster and the other is Rslave, wherein n is any integer more than one. If the write request Write is enabled and the overflow Wacc does not occur, Wmaster increases by one as shown in step 9 of FIG. 5. Also, Wmaster increases by one if the conditions no overflow, no servicing FIFO write request and Wacc not equal to zero are met. Rslave increases by one if the comparison Cpr (not shown) of Rslave and sampled Rmaster is not equal. The handshaking unit 504 in the read part is the same as that in the write part, except that the read and write elements and signals are exchanged.

Figure 7:
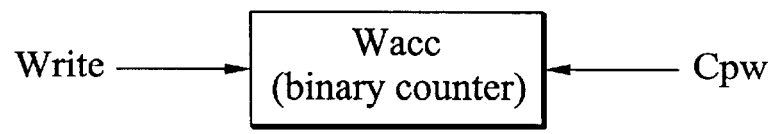
FIG. 7 is a block diagram of the overflow control circuit in the write part of FIG. 5 according to the invention.

FIG. 7 is a block diagram of the overflow controller 505 in the write part of FIG. 5 according to the invention. The overflow controller is a binary counter Wacc. Wacc increases by one if the write request is enabled and the overflow is detected, as shown in the step between steps 4 and 5 of FIG. 5. Wacc reduces by one if Wmaster has no overflow, Wacc is not zero and no FIFO write request Write is serviced, as shown in the step between steps 6 and 7 of FIG. 5. The overflow controller 506 in the read part is the same as that in the write part, except that the read and write elements and signals are exchanged.

Figure 8:
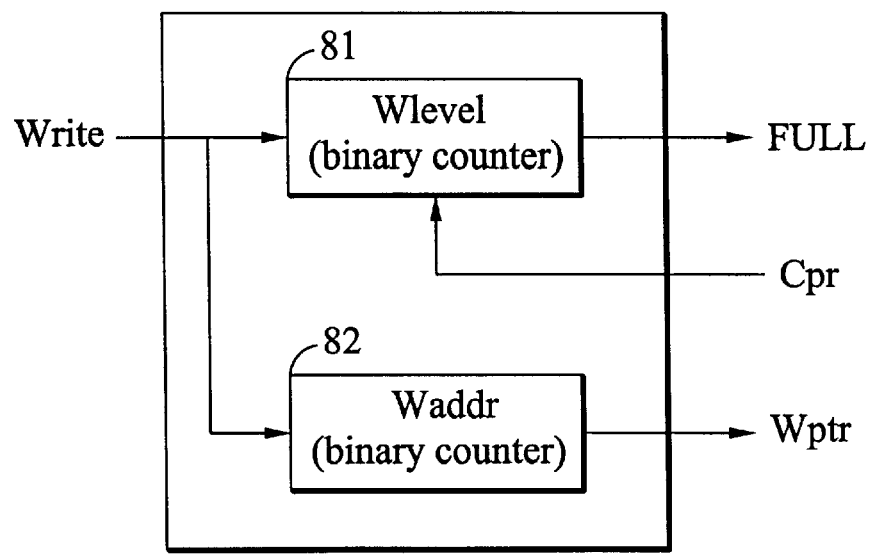
FIG. 8 is a block diagram of the FIFO status indicator in the write part of FIG. 3 according to the invention.

FIG. 8 is a block diagram of the FIFO status indicator in the write part of FIG. 3 according to the invention. The status indicator contains a circular binary counter Waddr for indicating a write address by the write pointer Wptr and a binary counter Wlevel for indicating used size of the FIFO. Waddr increases by one if the write request Write is serviced. Wlevel increases by one if the comparison Cpr of the Rslave and sampled Rmaster is equal and the write request Write is enabled. Wlevel reduces by one if the comparison Cpr is not equal and no FIFO write request Write is serviced. Also, the status indicator 502 in the read part is the same as that in the write part, except that the read and write elements and signals are exchanged.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. An apparatus for controlling an asynchronous First-In-First-Out (FIFO) memory comprising an dual port FIFO memory having a read port and a write port for respectively reading out and writing in data at different operation frequencies, a pair of n-bit circular Gray code counters for handshaking read-out and write-in operation frequencies in the dual port FIFO memory and an n-bit overflow binary counter for accumulating overflows of the pair of n-bit circular Gray code counters, wherein n is any integer more than one.

2. The apparatus of claim 1, further comprising an FIFO status counter, connected to the dual port FIFO memory, the pair of n-bit circular Gray code counters and the n-bit overflow binary counter, for indicating the operation address and the utility rate of the dual port FIFO memory, so that the n-bit overflow binary counter continues the coming request count when the dual port FIFO memory is not full and the pair of n-bit circular Gray code counters is overflow.

3. The apparatus of claim 2, wherein the operation address is a read-out address.

4. The apparatus of claim 2, wherein the operation address is a write-in address.

5. An apparatus for controlling an asynchronous First-In-First-Out (FIFO) memory, comprising:

a write overflow controller, having a write accumulation binary counter with a first input terminal to receive an external write request, a second input terminal, a third input terminal and an output terminal to output a write accumulation signal;

a write handshaking unit, connected to the write overflow controller, having a first synchronizing circuit to receive a write slave signal and output a first synchronous signal to the second input terminal of the write overflow controller, a write master counter with n-bit circular Gray code to receive the first synchronous signal, the external write request and the write accumulation signal and output a write master signal to the third input terminal of the write overflow controller for comparison with the write slave signal to generate the write accumulation signal, a second synchronizing circuit to receive a read master signal and output a second synchronous signal, and a read slave counter with n-bit circular Gray code to receive the second synchronous signal and output a read slave signal;

a write-in FIFO status indicator, including a write pointer having an input terminal to receive the external write request and an outuput terminal to output a write address signal, and a write level pointer having a first input terminal to receive the second synchronous signal from the write handshaking unit, a second input terminal to receive the read slave signal from the write handshaking unit for comparison with the read master signal, a third input terminal to receive the external write request and an output terminal to output an FIFO memory full signal to the external;

an asynchronous dual port FIFO memory, having an input port connected to the write handshaking unit to write in data and an output port to read out data;

a read handshaking unit connected to the output port of the asynchronous dual port FIFO memory, having a third synchronizing circuit to receive the write master signal from the write handshaking unit and output a third synchronous signal, a write slave counter with n-bit circular Gray code to output the write slave signal to the first synchronizing circuit, a read master counter with n-bit circular Gray code having a first input terminal to receive an external read signal, a second input terminal, a first output terminal to output the read master signal to the second synchronizing circuit and a second output terminal, and a fourth synchronizing circuit having an input terminal to receive the read slave signal from the write handshaking unit and an output terminal to output a fourth synchronous signal;

a read overflow controller, having a read accumulation binary counter with a first input terminal to receive the external write request, a second input terminal to receive the fourth synchronous signal, and a third input terminal to receive the read master signal from the read handshaking unit for comparison with the read slave signal from the write handshaking unit and output a read accumulation signal to the second input terminal of the read master counter; and a read-out FIFO status indicator, including a read pointer having an input terminal to receive the external read request and an outuput terminal to output a read address signal, and a read level pointer having a first input terminal to receive the third synchronous signal from the read handshaking unit, a second input terminal to receive the write slave signal from the read handshaking unit for comparison with the write master signal, and a third input terminal to receive the external read request and an output terminal to output an FIFO memory empty signal to the external.

6. The apparatus of claim 5, wherein the first, second, third and fourth synchronizing circuits are a flip/flop.

7. An operation method, used in an apparatus for controlling an asynchronous First-In-First-Out (FIFO) memory comprising an dual port FIFO memory having a read port for reading out data and a write port for writing in data at different operation frequencies, a pair of n-bit circular Gray code counters for handshaking different read and write operation frequencies in the dual port FIFO memory and an n-bit overflow binary counter for accumulating overflows of the pair of n-bit circular Gray code counters, wherein n is any integer more than one, comprising the steps:

determining if the pair of n-bit circular Gray code counters have the same value except for zero;

determing the dual port FIFO memory status;

replacing the subsequent operation of the pair of n-bit circular Gray code counters with the n-bit overflow binary counter if the pair of n-bit circular Gray code counters have the same value except for zero and the dual port FIFO memory is not full when an FIFO request comes.

8. The operation method of claim 7, further comprising the step of outputting a full signal to the external if the dual port FIFO memory status indicates full.

9. The operation method of claim 7, further comprising the step of outputting an empty signal to the external if the dual port FIFO memory status indicates empty.

10. The operation method of claim 7, further comprising the step of reducing the n-bit overflow binary counter by one if the pair of n-bit circular Gray code counters do not have the same value and the n-bit overflow binary counter is not zero when no FIFO request is serviced.

11. The operation method of claim 10, wherein the FIFO request is any FIFO write request.

12. The operation method of claim 10, wherein the FIFO request is any FIFO read request.

* * * * *